(12) United States Patent
Suga et al.

(10) Patent No.: US 6,332,786 B1
(45) Date of Patent: Dec. 25, 2001

(54) ELECTRICAL CONNECTION DEVICE EMPLOYING AN ANISOTROPIC ELECTRICALLY CONDUCTIVE FILM

(75) Inventors: Yasuhiro Suga, Tochigi; Noriyuki Honda, Aichi, both of (JP)

(73) Assignee: Sony Corporation (JP)

(*) Notice: Subject to any disclaimer, the term of this patent is extended or adjusted under 35 U.S.C. 154(b) by 0 days.

(21) Appl. No.: 09/480,259

(22) Filed: Jan. 11, 2000

(30) Foreign Application Priority Data

Jan. 11, 1999 (JP) .................................................. 11-004657

(51) Int. Cl.$^7$ ...................................................... H01R 4/58
(52) U.S. Cl. ................................ 439/91; 439/66; 439/591
(58) Field of Search .................................. 439/91, 66, 591

(56) References Cited

U.S. PATENT DOCUMENTS

| | | | |
|---|---|---|---|
| 4,902,857 | * 2/1990 | Cranston et al. | 439/91 |
| 5,001,302 | * 3/1991 | Atsumi | 439/91 |
| 5,586,892 | * 12/1996 | Sato | 439/91 |
| 5,604,379 | * 2/1997 | Mori | 257/738 |
| 5,624,268 | * 4/1997 | Maeda et al. | 439/91 |
| 5,681,402 | * 10/1997 | Ichinose et al. | 136/265 |
| 5,813,870 | * 9/1998 | Gaynes et al. | 439/91 |
| 6,008,451 | * 12/1999 | Ichinose et al. | 136/256 |

* cited by examiner

*Primary Examiner*—Brian Sircus
*Assistant Examiner*—Hae Moon Hyeon
(74) *Attorney, Agent, or Firm*—Ronald P. Kananen; Rader, Fishman & Grauer PLLC

(57) ABSTRACT

An anisotropic electrically conductive film which reduces a connection resistance value in electrical connection to assure reliable electric connection, and an electrical connecting device employing this anisotropic electrically conductive film. To this end, metal coated particles having a resin (40) as a core material are dispersed in an insulating adhesive (8) to give an anisotropic electrically eonductive film. The resin (40) of the metal coated particles is coated with a metal layer having a thickness of 1000 to 3000 Å.

17 Claims, 3 Drawing Sheets

ELECTRICAL CONNECTION DEVICE EMPLOYING AN ANISOTROPIC ELECTRICALLY CONDUCTIVE FILM

BACKGROUND OF THE INVENTION

1. Field of the Invention

This invention relates to an electrical connection device employing an anisotropic electrically conductive film.

2. Description of the Related Art

In keeping up with the reduction in size and thickness of electronic components, the circuitry used in the electronic components is increasing in density and in precision in design rule. Since the connection between the electronic components and the fine-sized electrodes cannot be coped with by the conventional solder or a rubber connector, an adhesive or a filmed article, exhibiting anisotropy and electrical conductivity, referred to below as a connecting member, is preferentially used in order to cope with the tendency towards fine pitch.

This connecting member is comprised of an adhesive, containing a pre-set amount of the electrically conductive material, such as electrically conductive particles. This connecting member is provided between protuberant electrodes of the electronic components and an electrically conductive pattern of a printed circuit board and is pressured with or without heating to interconnect the electrodes of the electronic components and the printed circuit board. Moreover, the neighboring electrodes are insulated from each other and the protuberant electrodes are bonded and secured to the electrically conductive patterns of the printed circuit board.

The anisotropic electrically conductive film is mainly used as an adhesive film for the peripheral portions of a liquid crystal panel. Recently, the anisotropic electrically conductive film has come to be used in the field of semiconductor mounting in which a LSI (large-sized integrated circuit) chip is directly mounted on a resin substrate such as a mother board.

With the anisotropic electrically conductive film, electrically conductive particles are captured between electrodes desired to be connected to each other for establishing electrical connection therebetween. In the electrical connecting portion in the vicinity of the conventional liquid crystal panel, a large number of electrically conductive particles contributing to electrical connection can be provided, because of the large electrode area, so that the connection resistance hardly presented problems.

Meanwhile, in flip-chip mounting, which has recently attracted attention, endeavours have been made to reduce the pitch and the area of the electrodes, due to reduction in size of the components. In the connection employing the anisotropic electrically conductive film, the number of captured particles is reduced with the reduction in size of the electrodes, thus raising the resistance value per electrode.

Heretofore, tens to hundreds of particles can be provided between the electrodes. In recent mounting configurations, the number of the particles is reduced to only a few.

That is, in recent mounting configurations, the number of the particles of the anisotropic electrically conductive film taking part in the electrical connection is only a few, it is necessary to reduce the connection resistance value by these few particles to raise the electrical connection efficiency.

SUMMARY OF THE INVENTION

It is therefore an object of the present invention to provide an electrical connection device employing an anisotropic electrically conductive film, in which the value of the connection resistance by the small number of particles can be decreased to assure positive electrical connection.

In one aspect, the present invention provides an anisotropic electrically conductive film in which metal coated particles having a resin as a core material are dispersed in an insulating adhesive, wherein the resin of the metal coated particles is coated with a metal layer having a thickness of 1000 to 3000 angstroms (Å).

In the anisotropic electrically conductive film, the metal layer has a gold (Au) plating film with a thickness of 400 to 1000 Å. The metal layer is made up of the Au plating film and a nickel (Ni) layer.

In another aspect, the present invention provides an electrical connection device which, for electrically connecting first and second objects, employs an anisotropic electrically conductive film in which metal coated particles having a resin as a core material are dispersed in an insulating adhesive, wherein the resin of the metal coated particles is coated with a metal layer having a thickness of 1000 to 3000 Å.

In the electrical connection device, the metal layer has an Au plating film with a thickness of 400 to 1000 Å. The metal layer is made up of the Au plating film and a Ni layer.

Also, in the electrical connecting device, the first object is a printed circuit board, the second object is an integrated circuit and the printed circuit board and the integrated circuit are electrically connected to each other via the anisotropic electrically conductive film.

DESCRIPTION OF THE PREFERRED EMBODIMENTS

Figure 1:
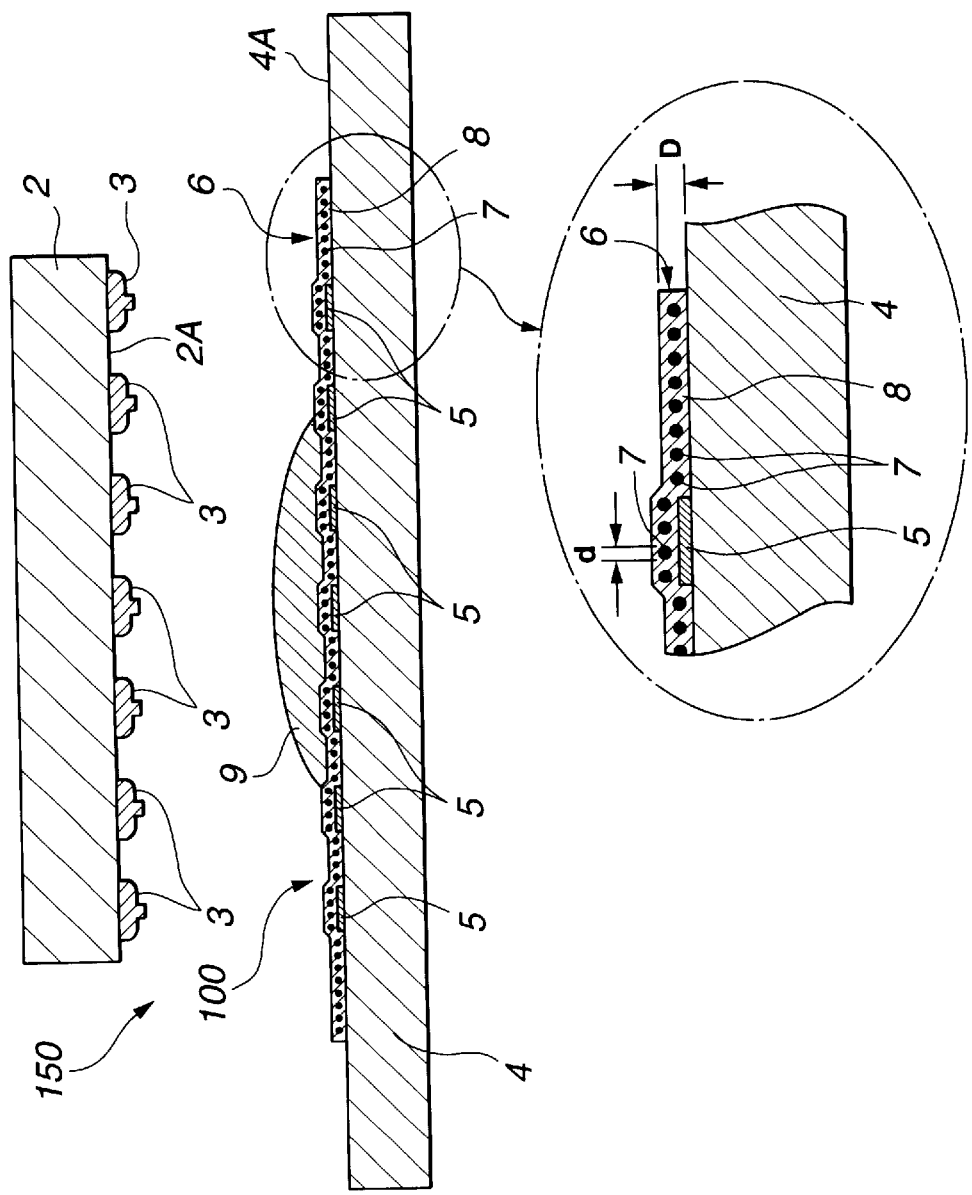
FIG. 1 illustrates an embodiment of an electronic apparatus having an anisotropic electrically conductive film according to a preferred embodiment of the present invention.

Referring to the drawings, a preferred embodiment of according to the present invention will be explained in detail.

The embodiment now explained represents a preferred form of execution of the present invention and hence is accompanied by many technically desirable limitations. However, the present invention is not limited to the embodiment illustrated unless there is made any statement to the contrary.

FIG. 1 shows a preferred example of execution in which the anisotropic electrically conductive film of the present invention is used as an electrical connection device. Specifically, FIG. 1 shows an embodiment of an electronic device 150 whose electrical connection is by an anisotropic electrically conductive film 100. This electronic device 150 includes a printed circuit board 4 and an integrated circuit (IC) 2 as an example of the electronic components.

On a surface 4A of the printed circuit board 4 is formed a wiring pattern 5 of a pre-set pattern shape. This wiring pattern 5 is a pattern of the electrical connection of, for example, aluminum or copper.

The IC 2 is provided on its major surface 2A with plural projecting electrodes 3. These projecting electrodes 3, also termed bumps, are arranged protuberantly in register with the wiring pattern 5 of the printed circuit board 4.

The printed circuit board 4 represents a first object, whilst the wiring pattern 5 of the printed circuit board 4 represents a wiring pattern of the printed circuit board. On the other hand, the IC 2 is an electronic component representing a second object. The electrical connection device 100 has the function of electrically interconnecting the wiring pattern 5 of the printed circuit board 4 and the projecting electrodes 3 of the IC 2 and for reliably mechanically bonding the printed circuit board 4 to the IC 2.

The anisotropic electrically conductive film 100, used as an electrical connection device, is hereinafter explained.

The anisotropic electrically conductive film 100 includes a filmed adhesive layer 6 containing electrically conductive particles, as shown in FIG. 1. The filmed adhesive layer 6, containing electrically conductive particles, is a filmed layer arrayed on the major surface 4A of the printed circuit board 4. The filmed adhesive layer 6 containing electrically conductive particles is bonded to the major surface 4A to overlie the wiring pattern 5.

Figure 2:
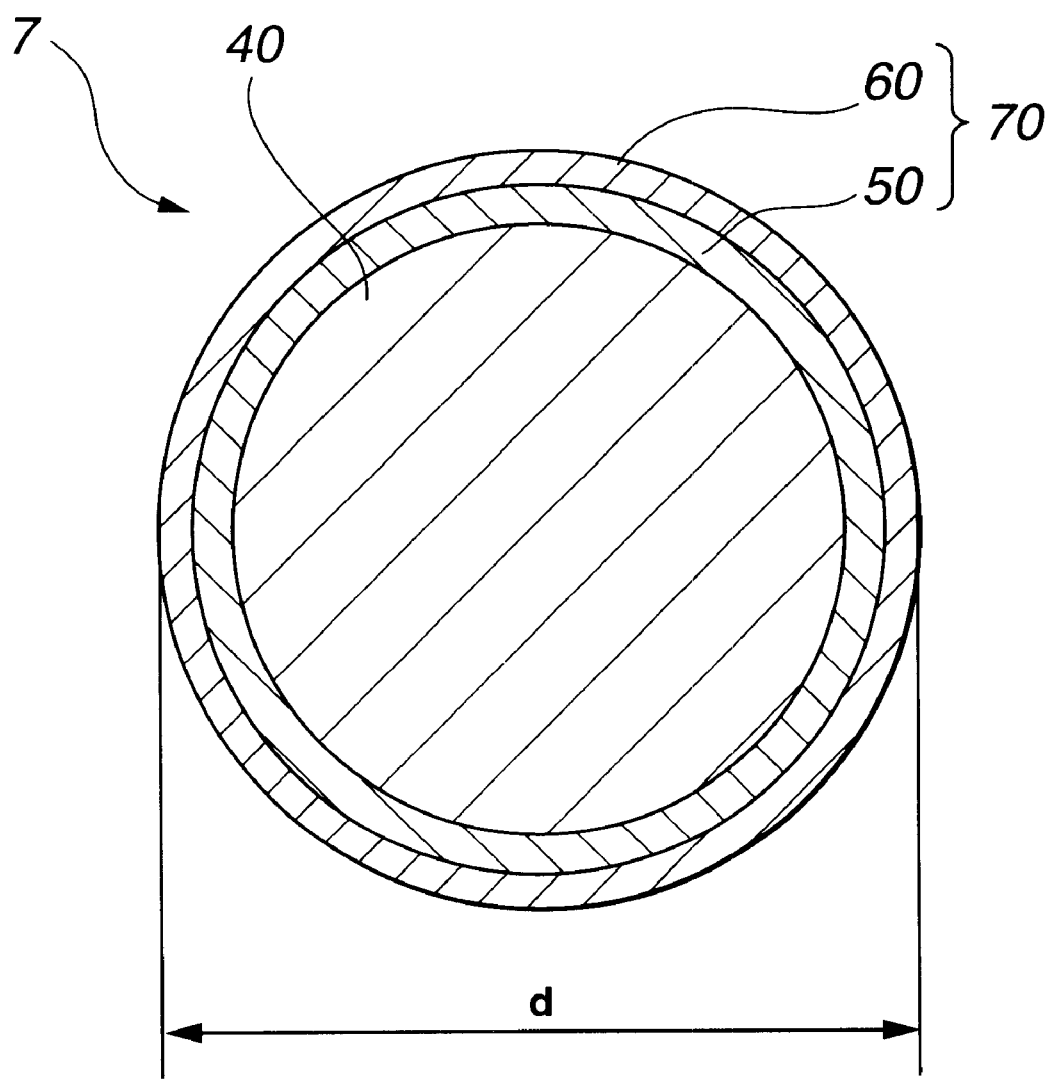
FIG. 2 illustrates an illustrative structure of an electrically conductive particle contained in the filmed adhesive layer shown in FIG. 1.

The filmed adhesive layer 6 containing the electrically conductive particles includes electrically conductive particles 7 and a binder 8. The electric particles 7 are metal-coated particles and a large number of the electrically conductive particles 7 are contained in the binder 8. The binder 8 has the function of an insulating adhesive for supporting electrically conductive particles 7. The electrically conductive particles 7 may, for example as shown in FIG. 2, be particles 40 of plastics or resin coated on its outer periphery with Ni and Au in this order.

The binder 8 contains plural or a large number of electrically conductive particles 7 and holds them against sporadic movement. The binder 8 is formed of, for example, a heat-curable epoxy resin exhibiting electrical insulating properties.

The thickness D of the binder 8 is preferably set so as to be slightly larger than or equal to the diameter d of the electrically conductive particles 7. In this manner, the electrically conductive particles 7 are encapsulated and held completely in the binder 8, as an electrically insulating layer, without being protruded therefrom.

The electrically conductive particles 7 are arrayed preferably uniformly in the binder as shown in FIG. 1.

Figure 3:
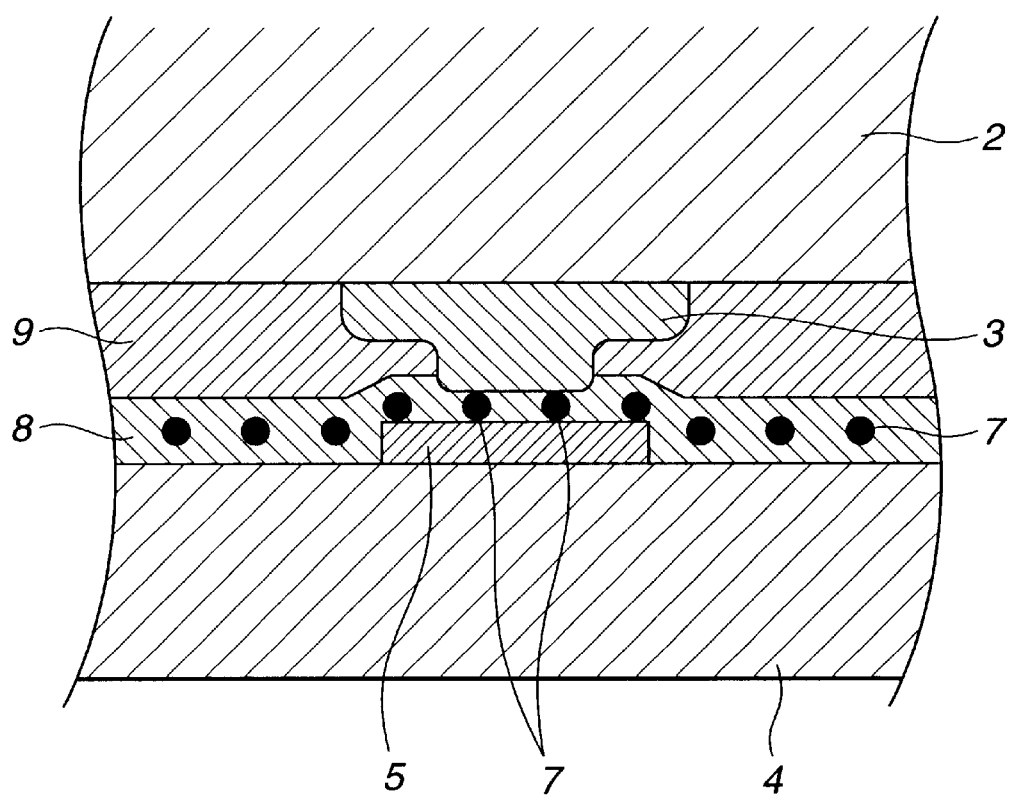
FIG. 3 illustrates an embodiment of an electronic apparatus having an anisotropic electrically conductive film according to a preferred embodiment of the present invention, where electrically conductive particles contained in a filmed adhesive layer electrically connect a wiring pattern with a projecting electrode.

As shown in FIG. 3, when the IC 2 is thrust via the anisotropic electrically conductive film 100 towards the major surface 4A of the printed circuit board 4, the electrically conductive particles 7 contained in the filmed adhesive layer 6, electrically connect the wiring pattern 5 with the projecting electrodes 3.

FIG. 2 shows an illustrative structure of the above-described electrically conductive particles 7. Each electrically conductive particle 7 has a plastic resin particle 40 as a core on the outer periphery of which are layered a Ni metal layer 50 and an Au plating layer 60. Thus, the entire peripheral surface of the resin particle 40 is coated by a metal layer 70 constituted by the Ni metal layer 50 and the Au plating layer 60.

Among the electrically conductive particles used in the anisotropic electrically conductive film, there are mainly metal (Ni) particles, and resin particles, that is particles comprised of resin particles coated with Ni—Au. Recently, resin-plated particles, as shown in FIG. 2, are frequently used. The reason is that the particle size is uniform i.e. (particle size distribution is sharp) to improve connection reliability.

The electrically conductive particle 7, which is a plated resin particle, has a diameter d equal to, for example, 3 to 5 $\mu$m.

The upper limit of the number of electrically conductive particles that can be captured between the electrodes of the wiring pattern 5 of the printed circuit board 4 and the projecting electrodes 3 of the IC 2 is subsequently determined by the area of the wiring pattern 5 and the projecting electrodes 3, as described above. Therefore, if the electrical connection resistance is to be decreased, it is optimum to improve the electrical characteristics of the electrical particles. As for the configuration, it is felt to be optimum to set the thickness of the metal layer (metal coating layer) 70 to a larger value.

Thus, in the configuration of the electrically conductive particles 7, shown in FIG. 2, a number of electrically conductive particles with variable thicknesses of the metal layer 70 were prepared and electrical properties thereof were comparatively evaluated.

EXAMPLE

[Evaluation Item 1] Measurement of Initial Connection Resistance Value

Sample for evaluation: IC 2 size 9.6 mm×9.6 mm (Projecting electrodes 3, 60 $\mu$m in diameter, 20 $\mu$m in height, 256 pins)

The projecting electrodes 3 of the IC 2 of the sample for evaluation has a diameter of 60 $\mu$m and a height of 20 $\mu$m, with the number of pins being 256.

Substrate is a built-up substrate (pattern, Cu/Ni—Au plating)

Method for measurement; resistance measurement by the daisy chain.

The daisy chain means the measurement of the one fill round of a mounted sample; (resistance value)=(connection resistance r)×(256 pins)+substrate wiring resistance+IC wiring resistance.

[Evaluation Item 2] Measurement of Conduction Reliability

The sample used for measurement in the evaluation item 1 is injected into an environment test vessel to measure the initial connection resistance value continuously.

Environment condition: 85° C.—85%.

The resistance values as measured after 1000 hours under the above condition of less than 50$\Omega$, not less than 50$\Omega$ and less than 100$\Omega$, and more than 100$\Omega$ or non-conduction, were evaluated to be ○, Δ and ×, respectively. The number of samples N was set to 3.

[Materials Used for this Experiment]

1. Composition of the anisotropic electrically conductive adhesive

| i) bisphenol A-type epoxy | 50 parts |
| ii) latent hardener | 50 parts |
| iii) silane coupling agent | 0.5 part |

2. Electrically Conductive Particles

TABLE 1

| Electrically conductive particles | material | Ni layer thickness (Å) | Au layer thickness (Å) | particle size ($\mu$m) |
| --- | --- | --- | --- | --- |
| A | Ni | — | — | 5 or less |
| B | resin | 600 | 200 | 5 ± 0.1 $\mu$m |
| C | resin | 600 | 450 | 5 ± 0.1 $\mu$m |
| D | resin | 600 | 550 | 5 ± 0.1 $\mu$m |
| E | resin | 600 | 700 | 5 ± 0.1 $\mu$m |
| F | resin | 800 | 500 | 5 ± 0.1 $\mu$m |
| G | resin | 2200 | 1000 | 5 ± 0.1 $\mu$m |

[sample preparing conditions]
mounting conditions: temperature,160° C., time duration, 20 sec pressure, 5 kgf (6 kgf for electrically conductive particle A)

TABLE 2

|  | electrically conductive particles | <evaluation item 1> initial resistance value (Ω) | | <evaluation item 2> reliability decision |
|---|---|---|---|---|
|  |  | minimum to maximum | average |  |
| Ex. | C | 10.9 to 13.0 | 11.9 | ○ |
|  | D | 10.5 to 12.8 | 11.3 | ○ |
|  | E | 9.9 to 12.0 | 10.8 | ○ |
|  | F | 10.9 to 12.8 | 11.5 | ○ |
| Comp. Ex. | A | 11.5 to 14.1 | 13.5 | Δ |
|  | B | 17.5 to 20.5 | 18.9 | ○ |
|  | R in case of absence | 9.5 to 11.0 | 10.5 | x |
|  | G | 10.1 to 11.5 | 10.8 | x |

The electrically conductive particles A in table 1 use Ni metal powders as a core material. The electrically conductive particle is a Ni ball with a particle size being not larger than 5 μm. Thus, there is no pertinent value for the thickness of the Ni layer or the thickness value of the Au layer.

The electrically conductive particles B, C, D, E, F and G use resin as the plastic resin particle (core) 40. The resin may be any of polystyrene, acrylic, or benzo guanamine resins.

With the electrically conductive particles B to E, the thickness of the Ni layer is set to 600 Å, whilst the thickness of the Ni layer of the electrically conductive particle F is set to 800 Å. The thickness of the electrically conductive particle G is set to 2200 Å, while the thicknesses of the Au layers in the electrically conductive particles B to G are set to respective different values. The particle size of the electrically conductive particles B to G is set to 5±0.1 μm.

Among the conditions for preparing samples of these electrically conductive particles, the temperature, time and pressure are 160° C., 20° C. and 5 kgf, respectively. The pressure is set to 6 kgf only for the electrically conductive particles A.

In Table 2, the above-mentioned electrically conductive particles A to G are shown for the Examples and Comparative Examples of the present invention.

The electrically conductive particles C, D, E and F represent preferred Examples of the present invention, whereas the electrically conductive particles A, B, G and a case R for the electrically conductive particles being absent represent Comparative Examples for comparison with the preferred Examples.

As for the Examples and the Comparative Examples, the values for the evaluation items 1 and 2 and the results of decision on reliability are indicated in Table 2.

In this Table 2, the initial resistance value differs with the thickness of the Au plating layer of the electrically conductive particles. The thickness of the Au plating layer of the conventional electrically conductive particles is 200 to 300 Å, whereas, in the Examples C, D, E and F of the present invention, the thickness of the Au layer is set to a thickness twice that value. This enables the initial resistance value of the electrically conductive particles C, D, E and F to be decreased as compared to the initial resistance values of A, B, R and G of the Comparative Examples.

In the electrically conductive particles A, as Ni particles, and the Comparative Example R, devoid of the electrically conductive particles, in which the electrodes are contacted with each other and bonded by an insulating adhesive, the electrical connection reliability is not promising, even although the initial resistance value is low.

Thus, according to the present invention, the thickness of the metal layer 70 of FIG. 2 of 1000 to 3000 Å is desirable. If the thickness of the metal layer 70 is smaller than 1000 Å, the connection resistance is undesirably increased. If the metal layer 70 is larger than 3000 Å, the physical properties of the resin particles 40 as the core material are lost. That is, the resiliency of the resin is lost, such that reliability in electrical connection cannot be assured. That is, the physical properties and reliability approach to those of the metal particles.

The Au plating layer 60 preferably has the thickness of 400 to 1000 Å. If the thickness of the Au plating layer 60 is smaller than 400 Å, the connection resistance is undesirably increased. If the thickness of the Au plating layer 60 is larger than 1000 Å, the cost of the particles is increased.

In the electrical connection device employing the anisotropic electrically conductive film and the electrical connection device employing the anisotropic electrically conductive film, according to the present invention, electrically conductive particles in the adhesive film, obtained on dispersing the electrically conductive particles in the insulating adhesive, include a metal coating having the resin as the core material, with the thickness of the coating film being thicker than that of the conventional coating film. By so doing, the initial resistance value in the daisy chain measurement in a sample for evaluation can be decreased by 30 to 50% of the conventional values.

The present invention is not limited to the embodiment described above. For example, although the electrical connection device is provided between the printed circuit board 4 and the IC 2, it is possible to use other structures.

What is claimed is:

1. An anisotropic electrically conductive film in which metal coated particles having a resin as a core material are dispersed in an insulating adhesive, wherein said resin of the metal coated particles is coated with metal. that is formed of at least one layer, said metal having a total thickness of 1000 to 3000 Å.

2. The anisotropic electrically conductive film according to claim 1
   wherein
   said metal layer has an Au plating film with a thickness of 400 to 1000 Å.

3. The anisotropic electrically conductive film according to claim 2
   wherein
   said metal layer is made up of said Au plating film and a Ni layer.

4. An electrical connection device which, for electrically connecting first and second objects, employs an anisotropic electrically conductive film in which metal coated particles having a resin as a core material are dispersed in an insulating adhesive, wherein said resin of the metal coated particles is coated with metal that is formed of at least one layer, said metal having a total thickness of 1000 to 3000 Å.

5. The electrical connection device according to claim 4
   wherein
   said metal layer has an Au plating film with a thickness of 400 to 1000 Å.

6. The electrical connection device according to claim 5
   wherein
   said metal layer is made up of said Au plating film and a Ni layer.

7. The electrical connecting device employing the anisotropic electrically conductive film according to claim 4
   wherein
   said first object is a printed circuit board, said second object is an integrated circuit and wherein said printed circuit board and the integrated circuit are electrically connected to each other via said anisotropic electrically conductive film.

8. The anisotropic conductive film according to claim 1, wherein said film constitutes an electrical connection device for electrically interconnecting first and second objects.

9. The anisotropic conductive film according to claim 8, wherein said first object is a printed circuit board and said second object is an electrical component.

10. The anisotropic conductive film according to claim 9, wherein said printed circuit board includes a wiring pattern on a surface thereof and said electrical component includes a plurality of bumps arranged protuberantly and in register with said wiring pattern.

11. An anistotropic electrically conductive film according to claim 10 wherein said film comprises a metal coating layer made of Ni and Au.

12. An anistotropic electrically conductive film, comprising:
   a filmed adhesive layer containing electrically conductive particles and a binder that includes a resin, wherein the electrically conductive particles are coated with Ni and Au, and supported by said binder functioning as an insulating adhesive for said particles.

13. The anisotropic conductive film according to claim 12, wherein said resin is a heat-curable epoxy resin exhibiting electrical insulating properties.

14. The anisotropic conductive film according to claim 12 wherein a thickness D of the binder is larger than the diameter d of the electrically conductive particles.

15. The anisotropic conductive film according to claim 12 wherein the electrically conductive particles are arrayed uniformly in the binder.

16. The anisotropic conductive film according to claim 12 wherein each of the electrically conductive particles has a plastic resin particle as a core on the outer periphery of which are layered and Ni metal layer and a Au plating layer.

17. The anisotropic conductive film according to claim 16 wherein the electrically conductive particles have a diameter in a range of 3 to 5 micrometers.

* * * * *